(12) United States Patent
Ahn et al.

(10) Patent No.: US 7,696,520 B2
(45) Date of Patent: Apr. 13, 2010

(54) ORGANIC THIN FILM TRANSISTOR, METHOD OF MANUFACTURING THE SAME, AND ORGANIC LIGHT EMITTING DISPLAY DEVICE HAVING THE SAME

(75) Inventors: Taek Ahn, Suwon-si (KR); Min-Chul Suh, Suwon-si (KR); Jin-Seong Park, Suwon-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 149 days.

(21) Appl. No.: 11/528,022

(22) Filed: Sep. 26, 2006

(65) Prior Publication Data
US 2007/0132023 A1    Jun. 14, 2007

(30) Foreign Application Priority Data
Dec. 12, 2005    (KR) ...................... 10-2005-0121955

(51) Int. Cl.
*H01L 27/14*    (2006.01)
*H01L 29/04*    (2006.01)
*H01L 29/15*    (2006.01)
*H01L 31/036*   (2006.01)

(52) U.S. Cl. ..................... 257/72; 257/347; 257/59; 257/60; 257/E21.169

(58) Field of Classification Search .............. 257/72, 257/350, E21.169
See application file for complete search history.

(56) References Cited

U.S. PATENT DOCUMENTS

2006/0094166 A1*    5/2006    Kim et al. .................... 438/142
2006/0102894 A1*    5/2006    Masuda et al. ................ 257/40

FOREIGN PATENT DOCUMENTS

JP    2003-092410    3/2003
JP    2004-241528    8/2004

OTHER PUBLICATIONS

Korean Office Action issued Nov. 23, 2006 in Korean Patent Application10-2005-0121955.

* cited by examiner

*Primary Examiner*—Cuong Q Nguyen
*Assistant Examiner*—Cathy N Lam
(74) *Attorney, Agent, or Firm*—Knobbe Martens Olson & Bear LLP

(57) ABSTRACT

Provided is an organic thin film transistor that can prevents damage to source and drain electrodes when patterning an organic semiconductor layer, and a method of manufacturing an organic light emitting display device having the organic thin film transistor. The organic thin film transistor includes a source electrode and a drain electrode; an organic semiconductor layer that contacts the source and drain electrodes, and has an ashed surface except a channel area between the source and drain electrodes; a gate electrode insulated from the source electrode, the drain electrode, and the organic semiconductor layer; and a gate insulating film that insulates the gate electrode from the source electrode, the drain electrode, and the organic semiconductor layer.

19 Claims, 5 Drawing Sheets

ORGANIC THIN FILM TRANSISTOR, METHOD OF MANUFACTURING THE SAME, AND ORGANIC LIGHT EMITTING DISPLAY DEVICE HAVING THE SAME

CROSS-REFERENCE TO RELATED APPLICATIONS

This application claims the benefit of Korean Patent Application No. 10-2005-0121955, filed on Dec. 12, 2005, in the Korean Intellectual Property Office, the disclosure of which is incorporated herein in its entirety by reference.

BACKGROUND OF THE INVENTION

1. Field of the Invention

The present invention relates to an organic thin film transistor, a method of manufacturing the same, and an organic light emitting display device having the same, and more particularly, to an organic thin film transistor that can prevent damage to source and drain electrodes when an organic semiconductor is patterned, a method of manufacturing the same, and an organic light emitting display device having the same.

2. Description of the Related Technology

Thin film transistors are used in flat display devices such as liquid crystal display devices, and organic light emitting display devices, as switching devices to control the operation of each pixel or driving devices to drive each pixel.

The thin film transistor includes a semiconductor layer having source and drain electrodes separated from each other, a channel region formed between the source and the drain electrodes, and a gate electrode insulated from the source and drain electrodes and the semiconductor layer.

Thin film transistors having the above structure are arranged in an array, each acting as an independent switching device. To prevent cross-talk between adjacent thin film transistors, the semiconductor layer may be patterned. In a conventional silicon thin film transistor, a semiconductor layer formed of silicon is patterned by photolithography.

Recent studies into flexible display devices have attempted to use plastic substrates instead of conventional glass substrates. However, since the plastic substrate cannot be processed at a high temperature, it is difficult to use the conventional silicon substrate.

Accordingly, methods to form plastic substrates at a low temperature have been proposed. In particular, studies with regards to organic thin film transistors that can be processed at a low temperature, that is, thin film transistors in which a semiconductor layer is formed of an organic material, have been actively conducted. However, in the case of the organic thin film transistor, the semiconductor layer cannot be patterned by conventional photolithography. That is, when the conventional processes of wet or dry etching and photolithography are mixed, the organic semiconductor layer can be damaged, thereby degrading the thin film transistor.

SUMMARY OF CERTAIN INVENTIVE ASPECTS

One aspect of the invention provides an organic thin film transistor that can prevent damage to source and drain electrodes when an organic semiconductor is patterned, a method of manufacturing the same, and an organic light emitting display device having the same.

Another aspect of the invention provides an electronic device comprising an organic thin film transistor. The electronic device comprises: a first insulating layer (a non-conductive substrate or an insulating layer formed on or above a substrate); a source electrode formed over the first insulating layer; a drain electrode formed over the first insulating layer; an organic semiconductor layer formed over the first insulating layer and contacting the source and drain electrode, the organic semiconductor layer comprising a channel portion positioned between the source and drain electrodes; and a second insulating layer formed over the organic semiconductor layer, the source electrode and the drain electrode; wherein the organic semiconductor layer further comprises a non-channel portion interposed substantially throughout between the second insulating layer and either or both of the source and drain electrodes.

The non-channel portion may comprise a first portion interposed substantially throughout between the second insulating layer and the source electrode, and the non-channel portion may comprise a second portion interposed substantially throughout between the second insulating layer and the drain electrode. The channel portion of the organic semiconductor layer may have a first thickness. The non-channel portion of the organic semiconductor layer may have a second thickness. The first thickness may be substantially larger than the second thickness.

The non-channel portion may comprise a portion having a thickness which is sufficiently thin to avoid a cross-talk therethrough between two neighboring thin film transistors. The non-channel portion of the organic semiconductor layer may comprise a first semiconductor layer and a second semiconductor layer. The first semiconductor layer may be formed on and contacting the source electrode. The second semiconductor layer may be interposed between the first semiconductor layer and the second insulating layer. The first semiconductor layer may comprise a first material and the second semiconductor layer may comprise a second material, which is substantially different from the first material. The second material may comprise a laser treated result of the first material.

Either or both of the source and drain electrodes may be substantially free of cracks therein. The non-channel portion of the semiconductor layer may be produced by a method comprising: forming a layer comprising a semiconductor material on either or both of the source and drain electrodes; and applying a laser beam to the layer only to a certain depth thereof. Applying the laser beam to the layer may ablate a portion of the layer, thereby making the layer substantially thinner than the layer prior to applying the laser beam. Applying the laser beam to the layer may substantially change characteristics of the semiconductor material in a portion of the layer, thereby making the layer into two different sublayers.

The source and drain electrodes may comprise a noble metal. The source and drain electrodes may comprise one or more selected from the group consisting of Au, Ag, Pt, Ta, Pd and alloys of two or more of the foregoing. The device may further comprise a gate electrode, which is located under or over the channel portion.

The electronic device may comprise one or more selected from the group consisting of a thin film transistor, an integrated circuit comprising a thin film circuit, a partially fabricated electronic device, a display device and a consumer electronic device comprising a display. The electronic device may comprise an organic light emitting display device.

Another aspect of the invention provides a method of manufacturing an electronic device comprising an organic thin film transistor. The method comprises: providing an intermediate electronic device comprising a first insulating layer, a source electrode and a drain electrode, wherein the source and drain electrode is formed over the first insulating layer; forming an organic semiconductor layer comprising an organic semiconductor material over the first insulating layer, the source electrode and the drain electrode, the organic semiconductor layer comprising a channel portion positioned between the source and drain electrodes; and selectively applying a laser beam to a non-channel portion of the organic semiconductor layer, wherein applying the laser beam does not substantially expose either or both of the source and drain electrodes.

The method may further comprise, after applying the laser beam, forming a second insulating layer over the organic semiconductor layer. The non-channel portion of the organic semiconductor layer may be interposed substantially throughout between the second insulating layer and either or both of the source and drain electrodes. Applying the laser beam may ablate a portion of the organic semiconductor layer, thereby making the organic semiconductor layer substantially thinner than the organic semiconductor layer prior to applying the laser beam. Applying the laser beam may substantially change characteristics of the organic semiconductor material in a portion of the organic semiconductor layer, thereby making the organic semiconductor layer into two different sublayers.

Another aspect of the invention provides an organic thin film transistor comprising: a source electrode and a drain electrode; an organic semiconductor layer that contacts the source and drain electrodes, and has an ashed surface except a channel area between the source and drain electrodes; a gate electrode insulated from the source electrode, the drain electrode, and the organic semiconductor layer; and a gate insulating film that insulates the gate electrode from the source electrode, the drain electrode, and the organic semiconductor layer.

Another aspect of the invention provides an organic thin film transistor comprising: a source electrode and a drain electrode; an organic semiconductor layer that contacts the source and drain electrodes, the thickness of the organic semiconductor layer in a portion except a channel area between the source electrode and the drain electrode is smaller than the thickness of the organic semiconductor layer in the channel area; a gate electrode insulated from the source electrode, the drain electrode, and the organic semiconductor layer; and a gate insulating film that insulates the gate electrode from the source electrode, the drain electrode, and the organic semiconductor layer. The organic semiconductor layer may cover the source electrode and the drain electrode. The source and drain electrodes may be formed of a noble metal.

Another aspect of the invention provides an organic light emitting display device having the organic thin film transistor.

Yet another aspect of the invention provides a method of manufacturing an organic thin film transistor, comprising: forming a source electrode and a drain electrode; forming an organic semiconductor layer; ashing the surface of the organic semiconductor layer except a channel area by irradiating a laser beam onto the organic semiconductor layer; and forming a gate electrode and a gate insulating film that insulates the gate electrode from the source electrode, the drain electrode, and the organic semiconductor layer.

Another aspect of the invention provides a method of manufacturing an organic thin film transistor, comprising: forming a source electrode and a drain electrode; forming an organic semiconductor layer; irradiating a laser beam onto the organic semiconductor layer so that the thickness of the organic semiconductor layer in a portion except a channel area becomes smaller than the thickness of the organic semiconductor layer in the channel area; and forming a gate electrode and a gate insulating film that insulates the gate electrode from the source electrode, the drain electrode, and the organic semiconductor layer.

The forming of the organic semiconductor layer may be performed after the forming of the source and drain electrodes. The organic semiconductor layer may be formed to cover the source electrode and the drain electrode. The source and drain electrodes may be formed of a noble metal.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF CERTAIN INVENTIVE EMBODIMENTS

The invention will now be described more fully with reference to the accompanying drawings, in which exemplary embodiments of the invention are shown.

Figure 1:
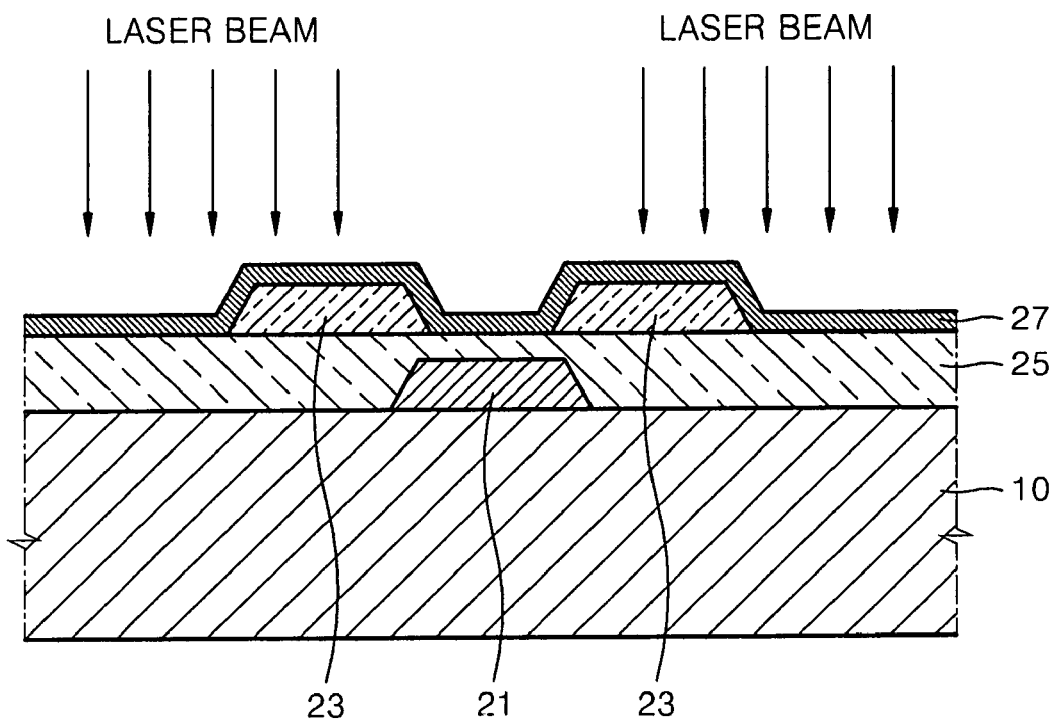
FIG. 1 is a cross-sectional view illustrating a method of irradiating a laser beam onto an organic semiconductor layer of an organic thin film transistor to pattern the organic semiconductor layer.
Figure 2:
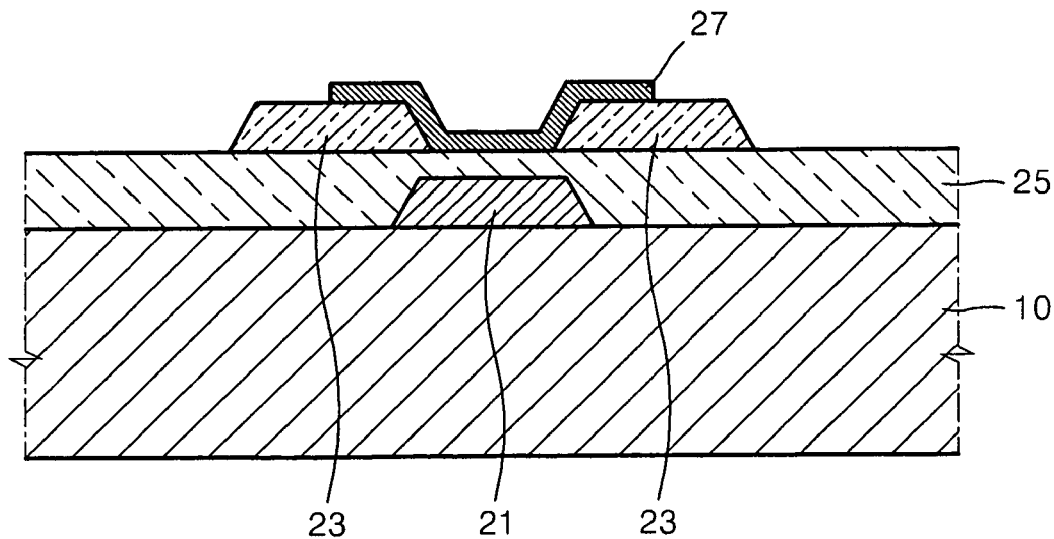
FIG. 2 is a cross-sectional view of an organic thin film transistor having a patterned organic semiconductor layer.
Figure 3:
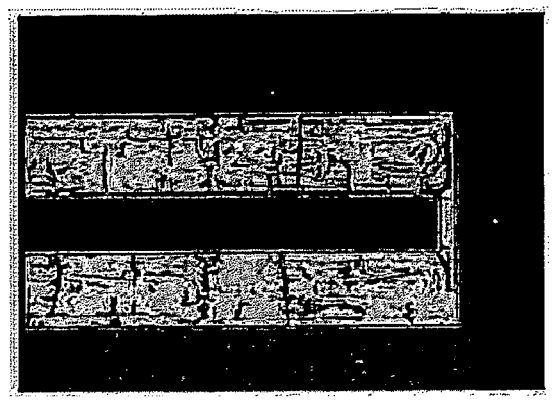
FIG. 3 is a photograph showing damaged source and drain electrodes of the organic thin film transistor of FIG. 2.

FIG. 1 is a cross-sectional view illustrating a method of irradiating a laser beam onto an organic semiconductor layer of an organic thin film transistor to pattern the organic semiconductor layer. FIG. 2 is a cross-sectional view of an organic thin film transistor having a patterned organic semiconductor layer. FIG. 3 is a photograph showing damaged source and drain electrodes of the organic thin film transistor of FIG. 2.

As described above, in manufacturing a thin film transistor, when an organic semiconductor layer is patterned using a method employing both wet etching and photolithography, the organic semiconductor layer is damaged and the organic thin film transistor is degraded. Accordingly, to prevent this problem, as depicted in FIG. 1, the organic semiconductor layer may be patterned by a laser, i.e. using a laser ablation technique (LAT). That is, a gate electrode 21 is formed on a substrate 10, a gate insulating film 25 is formed covering the gate electrode 21, and source and drain electrodes 23 are formed on the gate insulating film 25. An organic semiconductor layer 27 is formed covering the source and drain electrodes 23, as depicted in FIG. 2, and then the organic semiconductor layer 27 is patterned by a laser beam.

The organic semiconductor layer 27 can be patterned without damage using laser etching. However, in this case, it is possible to damage the source and drain electrodes 23 under the organic semiconductor layer 27 during the laser etching process. When a laser beam is irradiated to pattern the organic semiconductor layer 27, the source and drain electrodes 23 can be indirectly affected by the laser beam. As a result, heat from the laser beam can cause cracks on the surfaces of the source and drain electrodes 23. FIG. 3 is a photograph showing damaged source and drain electrodes 23 after patterning an organic semiconductor layer by laser etching when the source and drain electrodes 23 are formed of a noble metal. When the source and drain electrodes 23 are damaged, the organic thin film transistor is degraded. Therefore, it is necessary to prevent damage to the electrodes when patterning the organic semiconductor layer by laser etching.

Also, when the organic semiconductor layer 27 is patterned by laser etching, all portions except for an area between the source and drain electrodes 23 are removed. Particles produced in the removal process remain in the thin film transistor and degrade its characteristics.

Figure 4:
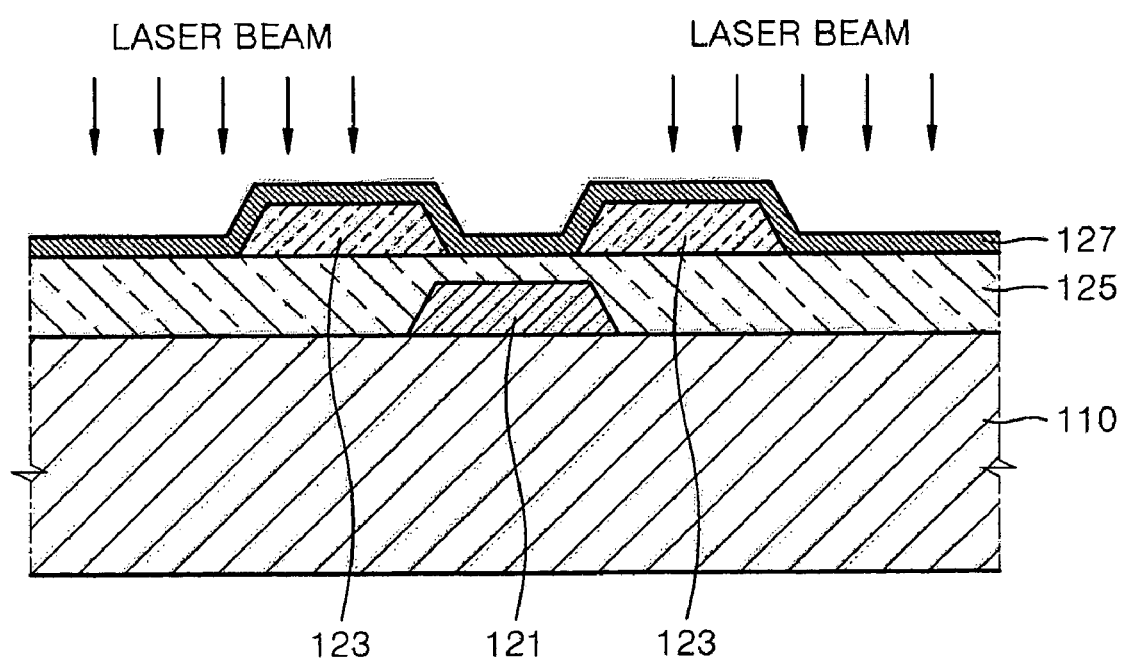
FIG. 4 is a cross-sectional view illustrating a method of irradiating a laser beam onto an organic semiconductor layer to manufacture an organic thin film transistor having a patterned organic semiconductor layer according to an embodiment.
Figure 5:
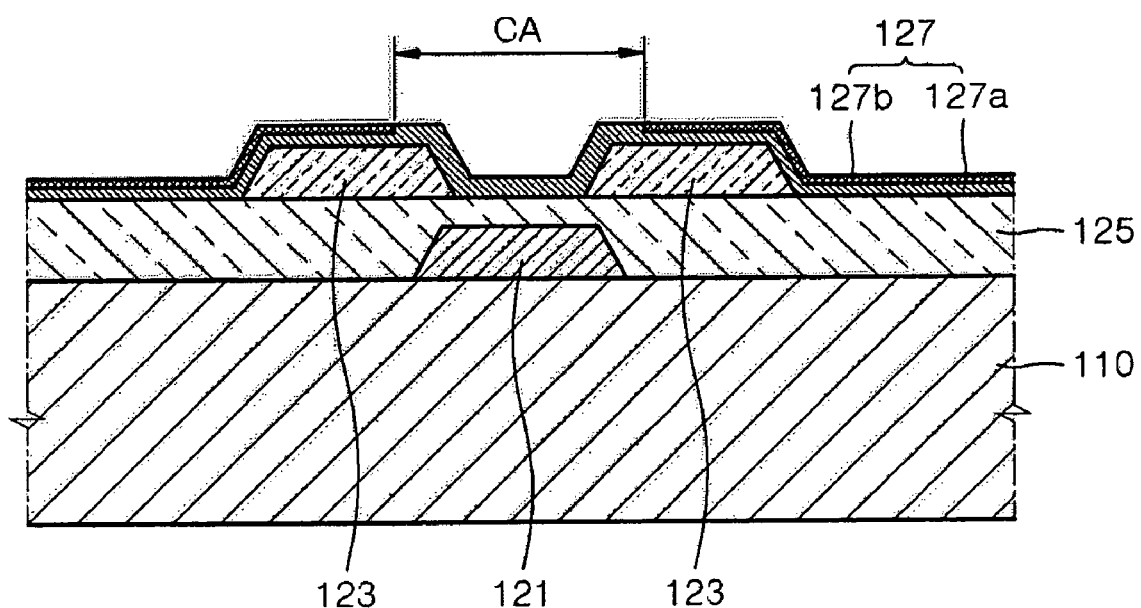
FIG. 5 is a cross-sectional view of an organic thin film transistor having an organic semiconductor layer patterned by irradiating a laser beam as depicted in FIG. 4, according to an embodiment.
Figure 6:
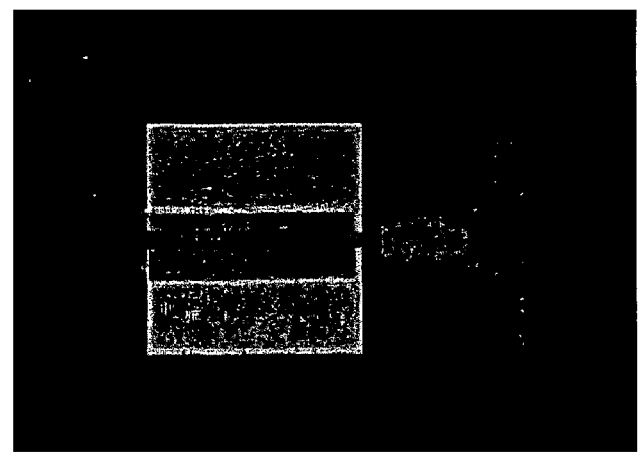
FIG. 6 is a photograph showing source and drain electrodes of the organic thin film transistor of FIG. 5.

FIG. 4 is a cross-sectional view illustrating a method of irradiating a laser beam onto an organic semiconductor layer to manufacture an organic thin film transistor having a patterned organic semiconductor layer according to an embodiment. FIG. 5 is a cross-sectional view of an organic thin film transistor having an organic semiconductor layer patterned by irradiating a laser beam as depicted in FIG. 4, according to an embodiment. FIG. 6 is a photograph showing source and drain electrodes of the organic thin film transistor of FIG. 5;

Referring to FIGS. 4 and 5, a gate electrode 121 is formed on a substrate 110. Source and drain electrodes 123 and an organic semiconductor layer 127 covering the source and drain electrodes 123 are formed on the gate electrode 121. A gate insulating film 125 that insulates the gate electrode 121 from the source and drain electrodes 123 and the organic semiconductor layer 127 is formed on the substrate 110.

The substrate 110 may be a glass substrate. In other embodiments, the substrate may be any suitable plastic substrates, for example, an acryl substrate, or a metal substrate.

The gate electrode 121 can be formed of various conductive materials such as Al or MoW. The source and drain electrodes 123 can also be formed of various conductive materials. For example, the electrodes 123 may be formed of noble metals such as gold, silver, tantalum, platinum, and palladium, in consideration of ohmic contact with the organic semiconductor layer 127. The gate insulating film 125 can be formed of an inorganic material such as silicon oxide or a silicon nitride, and/or various organic materials.

The organic semiconductor layer 127 can include at least one selected from the group consisting of pentacene, fused aromatic derivatives, oligothiophene and its derivatives, oligophenylene and its derivatives, thiophenylene vinylene and its derivatives, tetracarboxylic anhydride and its derivatives, phthalocyanine derivatives, and quinodymethane compounds.

As described above, the organic semiconductor layer 127 must be patterned to prevent cross-talk between adjacent thin film transistors. For this purpose, as depicted in FIG. 4, a laser beam is irradiated onto the organic semiconductor layer 127. The laser beam is irradiated onto the organic semiconductor layer 127 except for a channel region of the organic semiconductor layer 127. The channel region resides over the gate electrode 121 and between the source and drain electrodes 123. In this embodiment, the laser beam does not completely remove the organic semiconductor layer 127, but is irradiated with a limited intensity so that the irradiated portions of the organic semiconductor layer 127 are ashed. Accordingly, as depicted in FIG. 5, the organic thin film transistor includes the organic semiconductor layer 127, a surface of which contacts each of the source and drain electrodes 123, and is ashed except an area corresponding to a channel area CA between the source and drain electrodes 123. The irradiated portions of the organic semiconductor layer 127 may have an ashed layer having a thickness of about 10%, about 20%, about 30%, about 40%, about 50%, about 60%, about 70%, or about 80% of the thickness of the organic semiconductor layer in the channel area CA.

When the surface of the organic semiconductor layer 127 is ashed except the channel area CA between the source and drain electrodes 123, the ashed surface 127b does not generate cross-talk between adjacent thin film transistors, since it has reduced semiconductor characteristics. The channel area CA under a non-ashed surface 127a of the organic semiconductor layer 127 forms a channel between the source and drain electrodes 123 according to an electrical signal applied to the gate electrode 121 to transmit electrical signals between the source and drain electrodes 123. However, the channel area CA under the ashed surface 127b cannot transmit electrical signals because although it is not ashed, the area is damaged by the laser beam, thereby preventing cross-talk between adjacent thin film transistors.

When the surface of the organic semiconductor layer 127 is ashed except the channel area CA between the source and drain electrodes 123, the intensity of the laser beam is relatively low compared to the case when the organic semiconductor layer is removed except the area of the organic semiconductor layer corresponding to the channel area CA, as depicted in FIG. 2. Accordingly, the source and drain electrodes 123 under the organic semiconductor layer 127 are not damaged by the laser beam. In particular, when the source and drain electrodes 123 are formed of a noble metal such as Au or Ag, which has a high absorption rate of laser beam, the source and drain electrodes 123 are not damaged since the intensity of the laser beam is relatively low.

FIG. 6 is a photograph of the source and drain electrodes 123 of an organic thin film transistor manufactured by irradiating a laser beam to ash the surface of the organic semiconductor layer 127 except the channel area CA between the source and drain electrodes 123. When the photograph in FIG. 6 is compared to the photograph in FIG. 3, it can be seen that the source and drain electrodes 123 are free of damages.

Also, when a laser beam is used to remove an area of the organic semiconductor layer, particles are produced. In this case, a process of removing the particles or an equipment to remove the particles must be used to avoid degrading the thin film transistor. However, when the laser beam is used only to ash an area of the organic semiconductor layer, no particles are produced. Therefore, the quality of the product is maintained and the manufacturing cost is greatly reduced.

Figure 7:
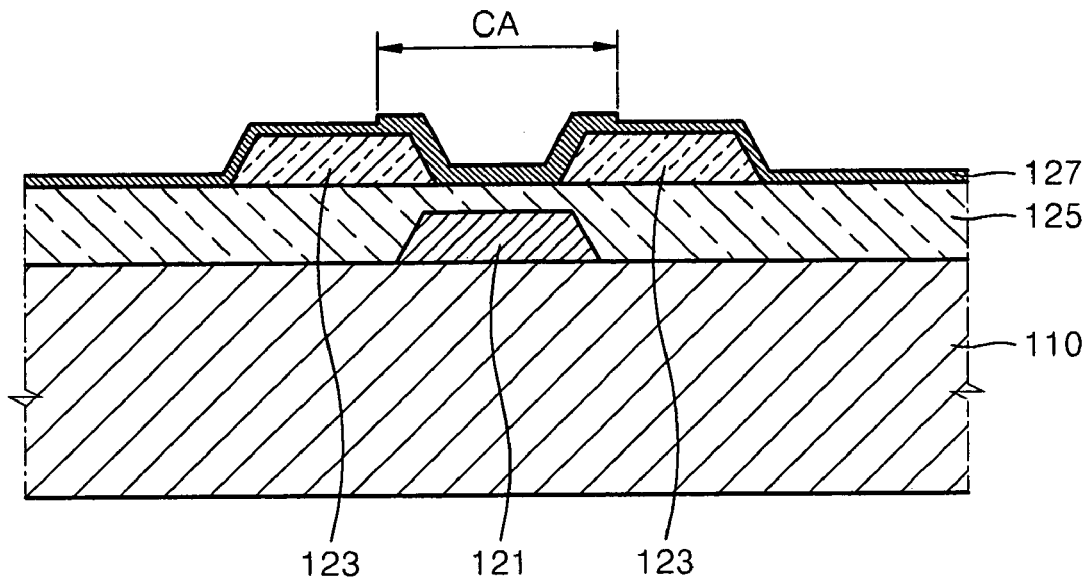
FIG. 7 is a cross-sectional view of an organic thin film transistor according to another embodiment.

FIG. 7 is a cross-sectional view of an organic thin film transistor according to another embodiment. The illustrated organic thin film transistor 127 has a different shape from the organic thin film transistor of the previous embodiment. That is, the organic semiconductor layer of the organic thin film transistor of the previous embodiment contacts the source and drain electrodes 123 and has an ashed surface except the channel area CA between the source and drain electrodes 123. However, in the organic semiconductor layer 127 of an organic thin film transistor according to the present embodiment, the organic semiconductor layer 127 contacts both the source and drain electrodes 123. In addition, the thickness of the organic semiconductor layer 127 in a portion except the channel area CA between the source and drain electrodes 123 is smaller than the thickness of the organic semiconductor layer 127 in the channel area CA. The thinner portions of the organic semiconductor layer 127 may have a thickness of about 10%, about 20%, about 30%, about 40%, about 50%, about 60%, about 70%, or about 80% of the thickness of the organic semiconductor layer in the channel area CA.

By using a laser beam to thin the organic semiconductor layer 127 outside the channel area CA, the semiconductor characteristics of the organic semiconductor layer 127 are reduced outside the channel area CA, thereby preventing cross-talk between adjacent organic thin film transistors.

When the organic semiconductor layer 127 is etched by a laser beam so that the thickness of the organic semiconductor layer 127 outside the channel area CA is thinner than the thickness of the organic semiconductor layer 127 in the channel area CA, the intensity of the laser beam is again relatively low compared to the case when the organic semiconductor layer is removed except the channel area CA as depicted in FIG. 2.

Accordingly, the source and drain electrodes 123 under the organic semiconductor layer 127 are not damaged when irradiating the laser beam. In particular, when the source and drain electrodes 123 are formed of a noble metal such as Au or Ag, which has a high absorption rate of the laser beam, the source and drain electrodes 123 are not damaged since the intensity of the laser beam is relatively low.

Also, far fewer particles are produced when irradiating the laser beam compared to the case when the laser beam completely removes a portion of the organic semiconductor layer. Therefore, the rate of product failure is significantly reduced and yield can be significantly increased.

Figure 8:
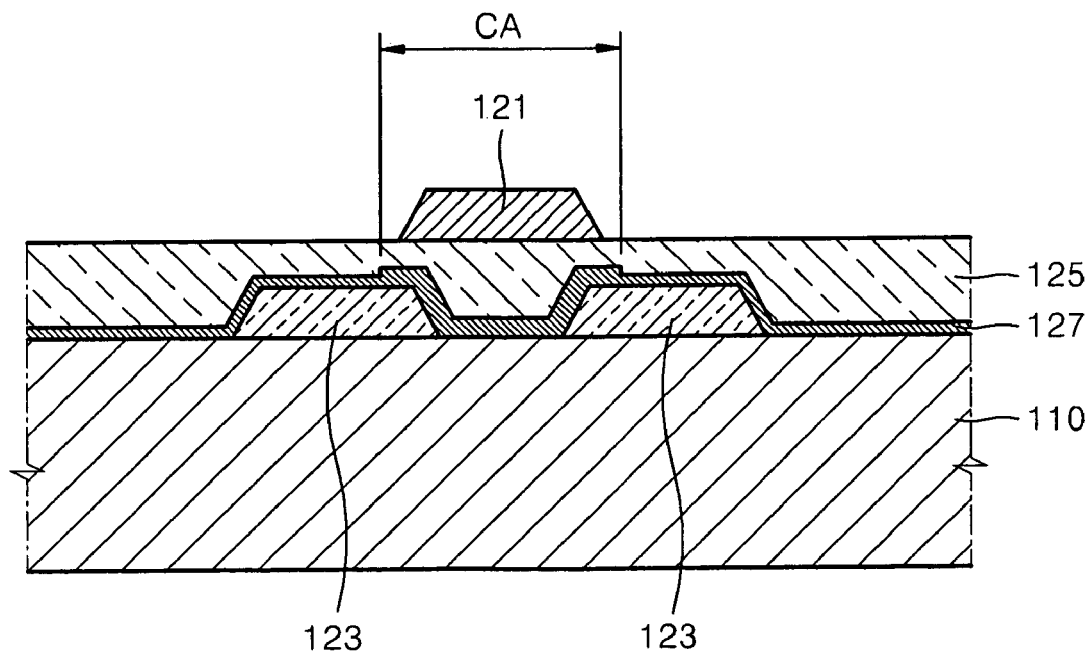
FIG. 8 is a cross-sectional view of an organic thin film transistor according to another embodiment.

The previous embodiments have described a bottom gate type organic thin film transistor structure, in which the gate electrode is below the source and drain electrodes. However, the embodiments can also be adapted to various modified structures including, as depicted in FIG. 8, a top gate type organic thin film transistor structure in which the gate electrode 121 is above the source and drain electrodes 123.

Figure 9:
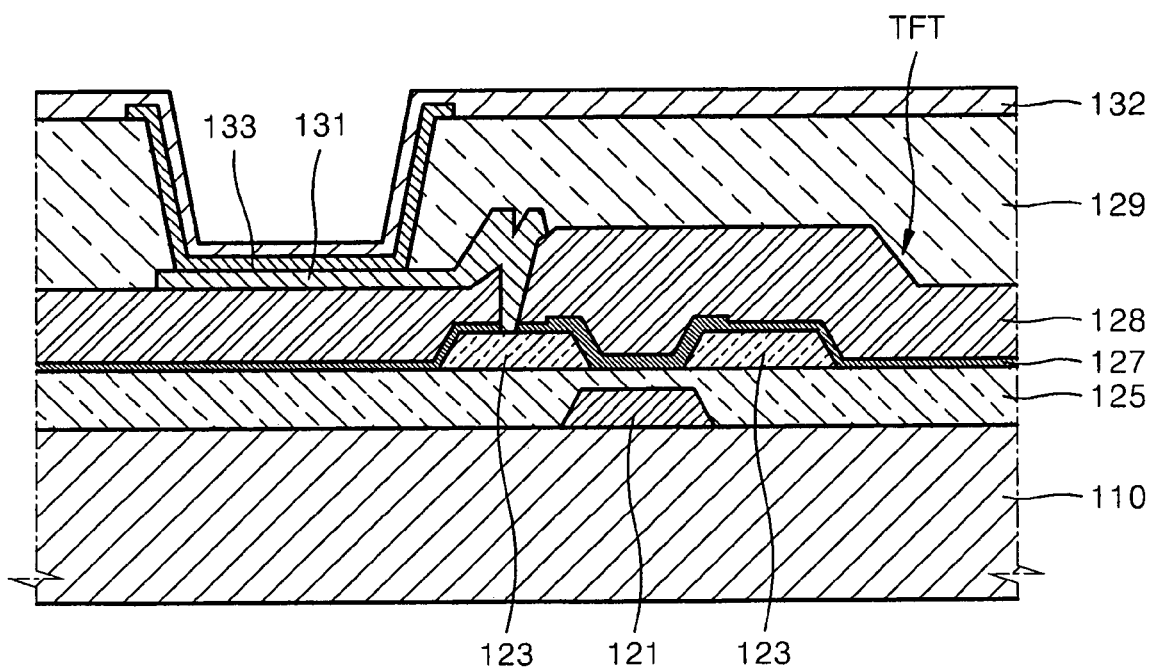
FIG. 9 is a cross-sectional view of an organic light emitting display device according to another embodiment.

FIG. 9 is a cross-sectional view of an organic light emitting display device according to another embodiment. Organic thin film transistors have high flexibility and can thus be used in various flexible flat panel display devices, such as liquid crystal display devices and organic light emitting display devices. An organic light emitting display device having the above organic thin film transistor will now be briefly described with reference to FIG. 9.

In the illustrated embodiment, the organic thin film transistor and the organic light emitting display element are located on a substrate 110. The organic light emitting display device can be of various types, but in the illustrated embodiment is an active matrix (AM) organic light emitting display device having an organic thin film transistor.

As depicted in FIG. 9, each sub-pixel includes at least one organic thin film transistor (TFT). Referring to FIG. 9, a $SiO_2$ buffer layer (not shown) can be formed on the substrate 110 as necessary, and an organic thin film transistor as described above can be formed on the buffer layer. The organic thin film transistor depicted in FIG. 9 is one of the organic thin film transistors described in the previous embodiments or a modified version thereof, but the present invention is not limited thereto.

A passivation film 128 is formed of $SiO_2$ on the organic thin film transistor, and a pixel defining film 129 formed of acryl or polyimide is formed on the passivation film 128. The passivation film 128 protects the organic thin film transistor, and serves as a planarizing film to planarize the upper surface of the organic thin film transistor.

Although not depicted, at least one capacitor can be connected to the organic thin film transistor. The circuit that includes the organic thin film transistor is not limited to the circuit depicted in FIG. 9, and various modifications are possible.

An organic light emitting element is connected to one of the source and drain electrodes 123. The organic light emitting element includes a pixel electrode 131 and a facing electrode 132 facing the pixel electrode 131, an intermediate layer 133 interposed between the pixel electrode 131 and the facing electrode 132 and at least a light emitting layer. The facing electrode 132 can be modified to have various other forms, for example, can be formed in common with a plurality of pixels.

In FIG. 9, the intermediate layer 133 is patterned corresponding to sub-pixels for convenience of explanation, but the intermediate layer 133 can be formed in one unit with intermediate layers 133 of adjacent sub-pixels. Also, a portion of the intermediate layer 133 can be formed to each sub-pixel and other portions of the layer can be formed in one unit with intermediate layers 133 of adjacent sub-pixels. That is, the intermediate layer 133 can be modified to various other forms.

The pixel electrode 131 functions as an anode and the facing electrode 132 functions as a cathode. In other embodiments, the polarity of the pixel electrode 131 and the facing electrode 132 can be reversed.

The pixel electrode 131 can be used as either a transparent electrode or a reflection electrode. When the pixel electrode 131 is used as a transparent electrode, the pixel electrode 131 can be formed of ITO, IZO, ZnO or $In_2O_3$. When the pixel electrode 131 is used as a reflection electrode, the pixel electrode 131 can be formed of ITO, IZO, ZnO or $In_2O_3$ on a reflection film formed of Ag, Mg, Al, Pt, Pd, Au, Ni, Nd, Ir, Cr, or a compound of these metals.

The facing electrode 132 can also be used as either a transparent electrode or a reflection electrode. When the facing electrode 132 is used as a transparent electrode, the facing electrode can include an auxiliary electrode layer or a bus electrode line formed of the same material as the transparent electrode, such as ITO, IZO, ZnO, or $InO_3$, on an intermediate layer, after forming the intermediate layer using a material such as Li, Ca, LiF/Ca, LiF/Al, Al, Ag, Mg, or a compound of these materials. When the facing electrode 132 is used as a reflection electrode, it is formed by depositing Li, Ca, LiF/Ca, LiF/Al, Al, Ag, Mg, or a compound of these metals.

The intermediate layer 133 between the pixel electrode 131 and the facing electrode 132 can be formed of a small molecular weight organic material or a polymer organic material. If the intermediate layer 133 is formed of a small molecular weight organic material, the intermediate layer 133 can be formed in a single or a composite structure by stacking a hole injection layer (HIL), a hole transport layer (HTL), an emissive layer (EML), an electron transport layer (ETL), and an electron injection layer (EIL). An organic material that can be used for forming the intermediate layer 133 includes copper phthalocyanine (CuPc), N,N'-Di(naphthalene-1-yl)-N,N'-diphenyl-benzidine (NPB), and tris-8-hydroxyquinoline aluminum (Alq3). The small molecular weight organic material can be deposited by an evaporation method using masks.

If the intermediate layer 133 is formed of a polymer organic material, the intermediate layer 133 can have a structure having a HTL and an EML. The HTL can be formed of a polymer organic material such as poly-(2,4)-ethylene-dihydroxy thiophene (PEDOT) and the EML can be formed of a polymer organic material such as Poly-Phenylenevinylene (PPV) or Polyfluorene.

An organic light emitting element formed on the substrate is sealed using a facing member (not shown). The facing member can be formed of the same material as the substrate, such as glass or plastic, or can be formed of a metal cap.

A light emitting display device that accurately renders an image can be manufactured by employing the organic thin film transistors according to the previous embodiments and modified versions of the present invention in the organic light emitting display device.

Also, in the above embodiments, the present invention has been described mainly with regard to the structure of an organic light emitting display device, but the present invention is not limited thereto. That is, the present invention can be applied to any display device that includes organic thin film transistors.

An organic thin film transistor and an organic light emitting display device having the organic thin film transistor can provide the following advantages. First, cross-talk between adjacent organic thin film transistors can be effectively prevented. Second, damage to source and drain electrodes under the organic semiconductor layer can be prevented. Third, manufacturing facilities and processes can be greatly simplified since no dust collector is required, thereby reducing the manufacturing cost and increasing yield.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An electronic device comprising an organic thin film transistor, the organic thin film transistor comprising:
    a source electrode;
    a drain electrode spaced apart from the source electrode;
    an organic semiconductor layer that contacts the source and drain electrodes, the organic semiconductor layer comprising a channel portion positioned between the source and drain electrodes and a non-channel portion outside the channel portion;
    a gate electrode insulated from the source electrode, the drain electrode, and the organic semiconductor layer; and
    a gate insulating film that insulates the gate electrode from the source electrode, the drain electrode, and the organic semiconductor layer,
    wherein the non-channel portion of the organic semiconductor layer comprises a first semiconductor layer and a second semiconductor layer, wherein the channel portion of the organic semiconductor layer comprises the first semiconductor layer, wherein the first semiconductor layer directly contacts the source and drain electrodes, wherein the first semiconductor layer comprises a first material, and wherein the second semiconductor layer comprises a second material which is substantially different from the first material, wherein the second semiconductor layer does not extend into the channel portion of the organic semiconductor layer between the source and drain electrodes.

2. The device of claim 1, wherein the organic semiconductor layer covers the source electrode and the drain electrode.

3. The device of claim 1, wherein the second material comprises a laser treated result of the first material.

4. The device of claim 1, wherein the second material comprises an ashed result of the first material.

5. The device of claim 1, wherein either or both of the source and drain electrodes are substantially free of cracks therein.

6. The device of claim 1, wherein the non-channel portion of the semiconductor layer are produced by a method comprising:
    forming a layer comprising a semiconductor material on either or both of the source and drain electrodes; and
    applying a laser beam to the layer only to a certain depth thereof.

7. The device of claim 6, wherein applying the laser beam to the layer comprising the semiconductor material substantially changes characteristics of the semiconductor material in a portion of the layer comprising the semiconductor material, thereby making the layer comprising the semiconductor material into two different sublayers.

8. The device of claim 1, wherein the source and drain electrodes are formed of a noble metal.

9. The device of claim 1, wherein the source and drain electrodes comprise one or more selected from the group consisting of Au, Ag, Pt, Ta, Pd and alloys of two or more of the foregoing.

10. The device of claim 1, wherein the electronic device comprises an organic light emitting display device.

11. An electronic device comprising an organic thin film transistor, the organic thin film transistor comprising:
    a source electrode;
    a drain electrode spaced apart from the source electrode;
    an organic semiconductor layer that contacts the source and drain electrodes, the organic semiconductor layer comprising a channel portion positioned between the source and drain electrodes and a non-channel portion outside the channel portion;
    a gate electrode insulated from the source electrode, the drain electrode, and the organic semiconductor layer; and
    a gate insulating film that insulates the gate electrode from the source electrode, the drain electrode, and the organic semiconductor layer,
    wherein the channel portion of the organic semiconductor layer has a first thickness, wherein the non-channel portion of the organic semiconductor layer has a second thickness, and wherein the first thickness is substantially larger than the second thickness such that a lower surface of the organic semiconductor layer on top of the source and drain electrodes is substantially flat, and an upper surface of the organic semiconductor layer on top of the source and drain electrodes includes a step.

12. The device of claim 11, wherein the second thickness is sufficiently thin to avoid a cross-talk therethrough between two neighboring thin film transistors.

13. The device of claim 11, wherein the organic semiconductor layer covers the source electrode and the drain electrode.

14. The device of claim 11, wherein either or both of the source and drain electrodes are substantially free of cracks therein.

15. The device of claim 11, wherein the non-channel portion of the semiconductor layer are produced by a method comprising:
    forming a layer comprising a semiconductor material on either or both of the source and drain electrodes; and
    applying a laser beam to the layer only to a certain depth thereof.

16. The device of claim 15, wherein applying the laser beam to the layer ablates a portion of the layer, thereby making the layer substantially thinner than the layer prior to applying the laser beam.

17. The device of claim 11, wherein the source and drain electrodes are formed of a noble metal.

18. The device of claim 11, wherein the source and drain electrodes comprise one or more selected from the group consisting of Au, Ag, Pt, Ta, Pd and alloys of two or more of the foregoing.

19. The device of claim 11, wherein the electronic device comprises an organic light emitting display device.

* * * * *